United States Patent [19]
Gregor et al.

[11] Patent Number: 5,110,756
[45] Date of Patent: May 5, 1992

[54] METHOD OF SEMICONDUCTOR INTEGRATED CIRCUIT MANUFACTURING WHICH INCLUDES PROCESSING FOR REDUCING DEFECT DENSITY

[75] Inventors: Richard W. Gregor; Chung W. Leung, both of Allentown, Pa.

[73] Assignee: AT&T Bell Laboratories, Murray Hill, N.J.

[21] Appl. No.: 725,706

[22] Filed: Jul. 3, 1991

[51] Int. Cl.⁵ .................................... H01L 21/76
[52] U.S. Cl. ...................... 437/70; 437/61; 437/69; 437/52
[58] Field of Search ............. 437/70, 69, 52, 61; 148/DIG. 109

[56] References Cited

U.S. PATENT DOCUMENTS

| | | | |
|---|---|---|---|
| 4,750,024 | 6/1988 | Schreck | 357/23.5 |
| 4,853,895 | 8/1989 | Mitchell et al. | 437/43 |
| 4,947,222 | 8/1990 | Gill et al. | 357/23.5 |
| 5,010,028 | 4/1991 | Gill et al. | 437/52 |
| 5,012,307 | 4/1991 | Gill et al. | 357/54 |
| 5,032,533 | 7/1991 | Gill et al. | 437/52 |

OTHER PUBLICATIONS

"Journal of Vacuum Science and Technology," 16.

Primary Examiner—Brian E. Hearn
Assistant Examiner—Trung Dang
Attorney, Agent, or Firm—Richard D. Laumann

[57] ABSTRACT

Defect density in a semiconductor process sequence that uses two local oxidations is reduced by using an approximately 1:1 ratio of nitride to oxide thickness in the second local oxidation step and an annealing step.

4 Claims, 2 Drawing Sheets

METHOD OF SEMICONDUCTOR INTEGRATED CIRCUIT MANUFACTURING WHICH INCLUDES PROCESSING FOR REDUCING DEFECT DENSITY

TECHNICAL FIELD

This invention relates to a method of integrated circuit manufacturing which includes processing to reduce the number of defects produced by ion implantation and local oxidation processes.

BACKGROUND OF THE INVENTION

Most semiconductor integrated circuit processing sequences include steps which selectively or locally oxidize portions of the substrate. In a typical and pervasively used processing sequence, selected portions of the substrate are exposed by patterning a structure having, for example, oxide and silicon nitride layers, and then oxidizing the exposed portions of the substrate. The nitride layer is typically relatively thick as compared to the oxide layer to reduce oxide growth under the nitride layer. The oxidized substrate portions, termed field oxides, provide electrical isolation between individual devices.

Some devices are fabricated with processing sequences that use more than one selective local oxidation step. One such type device is termed an EEPROM which is an acronym for electrically erasable programmable read-only memory. The second oxidation is of a heavily doped region which is typically formed by ion implantation. The region is defined by depositing second oxide and nitride layers and patterning the nitride layer to expose selected portions of the oxide layer between the field oxides. The implanted region functions as the bit line, as well as the source/drain region, of a field effect transistor and the oxide formed by the second oxidation serves as a platform for the gate structure which controls the EEPROM device. For descriptions of exemplary structures see, for example, U.S. Pat. Nos. 4,750,024 and 4,853,895 issued on Jun. 7, 1988 and Aug. 1, 1991, respectively.

The ion implantation causes damage, i.e., creates defects, in the substrate which may adversely affect device operation. Furthermore, the second oxidation process may increase the defect density or cause the defects to propagate to otherwise good regions of the substrate. The nitride layer used for the first oxidation step can lift up and thus provide some stress relief. However, the nitride layer used for the second oxidation is on both the field oxide and the thin oxide region. The nitride layer is relatively thick as compared to the thin oxide layer. The nitride layer on the field oxide is effectively pinned in position as this region does not increase significantly in thickness during the second oxidation. This portion of the nitride layer can not lift up and provide stress relief, although the portion of the nitride layer between the field oxide regions can lift up and provide some stress relief.

Several approaches have been taken in attempts to reduce the defect density caused by ion implantation. See, for example, *Journal of Vacuum Science and Technology*, 16, pp. 342-344, March/April 1979 for the description of one approach. This paper reports a two-step annealing process which reduces the defect density caused by ion implantation. The method disclosed reduced the dislocation density by annealing in inert ambients for one hour at 550 degrees C. and then for one hour at 1000 degrees C.

Methods for reducing the dislocation density in process sequences which have two local oxidation steps are desirable.

SUMMARY OF THE INVENTION

Semiconductor integrated circuits are fabricated by a process which oxidizes selected portions of the substrate to form first oxide regions and then deposits and patterns silicon nitride so that substantial portions of the first oxide regions are covered by the nitride and a substantial portion of the substrate is exposed. The substrate has an oxide surface. An ion implantation step is performed using the patterned nitride and photoresist as an implantation mask and is followed by a second selective oxidation step which forms second oxide regions in the exposed portions of the substrate. The defect density caused by the implantation and oxidation steps is reduced by using an approximately 1:1 ratio of nitride layer to oxide surface thicknesses and by annealing. Both the relatively thin nitride layer and the annealing step are needed to reduce the defect density.

In a preferred embodiment, both the oxide surface and nitride layer have a thickness less than approximately 70 nm. In another preferred embodiment, the first oxide regions are field oxide regions. In yet another preferred embodiment, the annealing step is at two temperatures with the second temperature being greater than the first temperature.

For reasons of clarity, the elements depicted are not drawn to scale.

DETAILED DESCRIPTION

Figure 1:
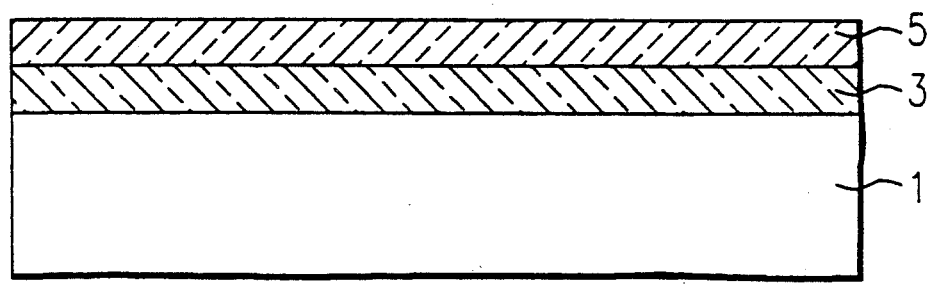
FIGS. 1-3 are sectional views of a portion of an integrated circuit at several stages of fabrication according to this invention.

Shown in FIG. 1 are substrate 1, oxide layer 3, and nitride layer 5. The term substrate is used to mean any material that lies underneath and supports another material. The term thus includes a silicon wafer and may further include a wafer with an epitaxial layer, etc. The oxide layer is a relatively thin layer, such as a pad oxide layer, grown by thermal oxidation. An exemplary thickness is approximately 20 nm. The nitride layer, e.g., silicon nitride with the nominal stoichiometry $Si_3N_4$, is thicker than the oxide layer. An exemplary thickness is 120 nm. Those skilled in the art will readily fabricate the structure depicted using conventional oxidation and deposition techniques.

Figure 2:
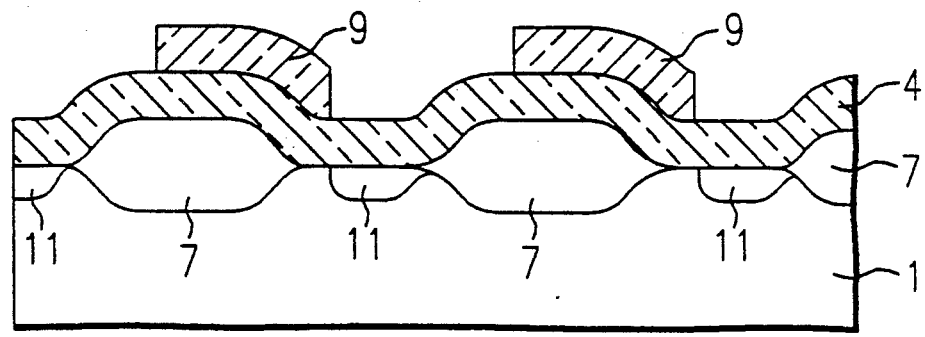

FIG. 2 depicts the structure of FIG. 1 after further processing. The nitride layer 5 is patterned using well known techniques to form regions which expose selected portions of oxide 3. An oxidation step is then performed which forms first oxide regions 7 in the exposed portions of the oxide 3. These regions will generally function as field oxide regions, i.e., the regions which electrically isolate individual devices from each other. The nitride layer and remaining oxide 3 are then removed using well-known techniques. A new, thin oxide layer 4 is grown or otherwise formed; the substrate thus has an oxide surface, and the entire surface is covered with a second nitride layer. An exemplary thickness for the oxide surface is approximately 35 nm. The second nitride layer 9 and oxide surface have approximately the same thickness and both are relatively thin; the thickness is generally less than 70 nm, and a thickness in the range between 30 and 40 nm is typical. Approximately the same thickness means that the thicknesses of the layers differ by less than 50 percent. These layers are then patterned so that the materials cover substantial portions of the field oxide regions, and substantial portions of the oxide surface between the field oxide regions are exposed. Ion implantation is then performed to form doped regions 11 in the exposed regions between the field oxide regions 7. The wafers are annealed after the implant to drive in the dopants and to reduce the defect density. Details of the annealing will be discussed later. The implant is typically an n-type impurity, such as arsenic. This is the structure depicted in FIG. 2.

Figure 3:
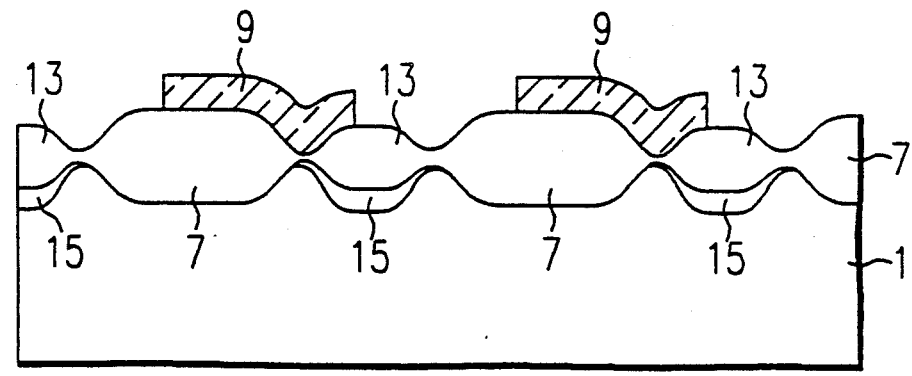

Further processing produces the structure depicted in FIG. 3. There is another oxidation step which produces second oxide regions 13 between the field oxide regions 7, i.e., the surfaces of the doped regions are oxidized. This oxidation step further drives the implanted dopants into the substrate to form buried dopant regions 15. These buried dopant regions 15 will ultimately serve as the bit line and source/drain regions of the field-effect transistor. Further processing is now performed to complete the fabrication of the EEPROM. This processing is well known and need not be described.

Figure 4:
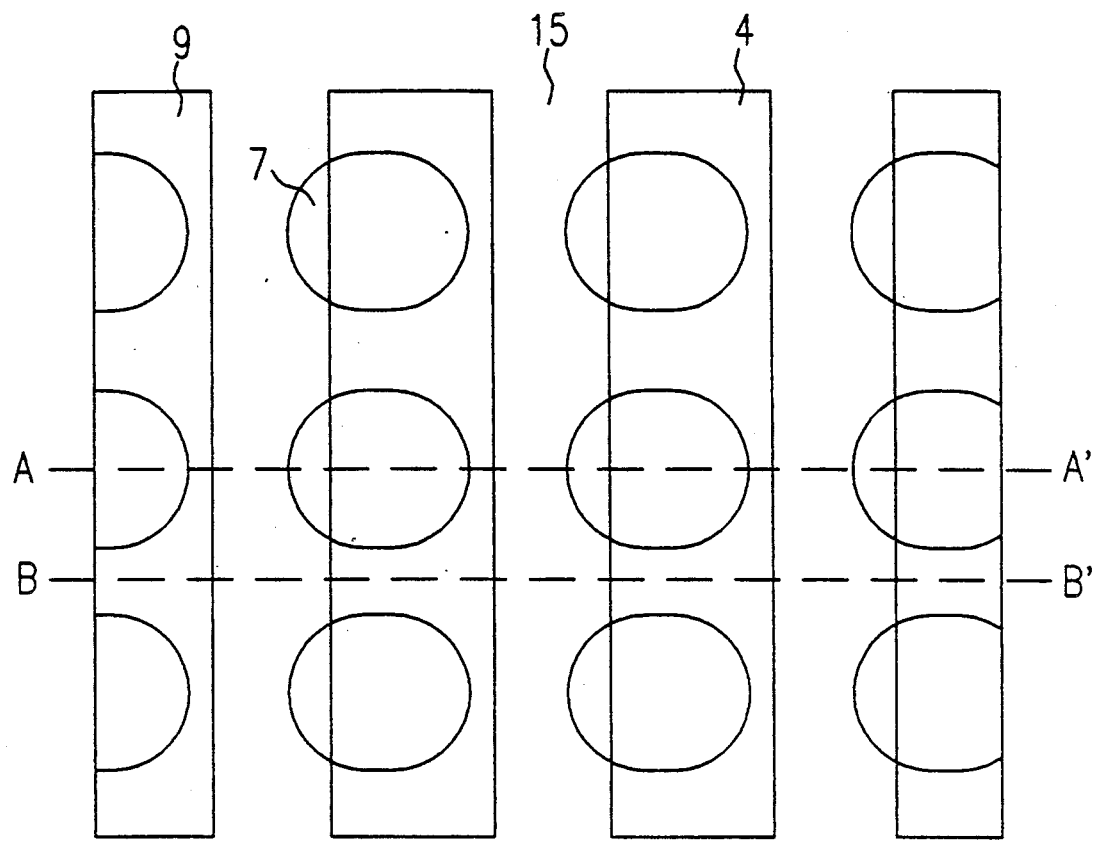
FIG. 4 is a top view of a portion of the integrated circuit depicted in FIG. 3.
Figure 5:
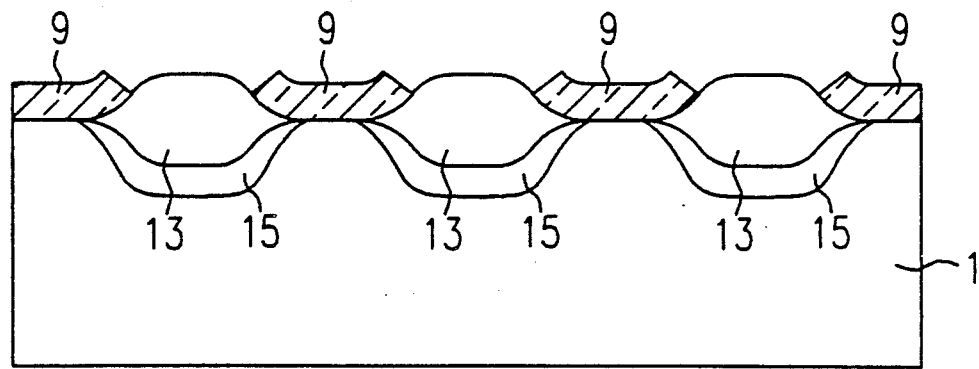
FIG. 5 is sectional view of the integrated circuit depicted in FIG. 4.

The ion implantation and oxidation steps, as previously mentioned, produce defects. The origin and nature of the defects is better understood by consideration of FIG. 4 which is a top view of the structure depicted in FIG. 3. FIG. 3 is along line A—A' of FIG. 4. Shown in FIG. 4 are first oxide regions 7 and patterned nitride layer 9 as well as the buried doped region 15 and oxide layer 4. As can be seen, the nitride layer 9 covers a substantial portion of the first oxide regions 7 and the oxide layer 4 between the first oxide regions 7. It was found that the defect density is highest along the line B—B' at the midpoint between the first oxide regions 7. FIG. 5 is a sectional view along line B—B' of FIG. 4. The nitride layer along line B—B' is entirely on the oxide substrate surface and can rise as the exposed portions of the substrate are oxidized. However, the nitride layer along line A—A' is effectively pinned on the first oxide region 7, i.e., the first oxide region 7 does not grow significantly during the second oxidation step and the nitride layer 9 on the first oxide region 7 can not rise to provide stress relief. Consequently, defects are generated which are concentrated at the midpoint, i.e., B—B' between the first oxide regions 7.

The defect density is controlled and reduced by two factors: (i) the oxide surface and the nitride layer are thin with approximately the same thickness, and (ii) there is a two step annealing process. We have found that both steps are required to reduce the defect density that results from the ion implantation step.

The annealing begins with a relatively low first temperature, approximately 500 degrees C., and then goes to a relatively high second temperature. The second temperature is typically 1000 degrees C. or greater.

We found that silicon defects are observed after the second local oxidation for either nitride thickness greater than 70 nm or second annealing temperature less than 1000 degrees C. The defects are not observed if there is no ion implantation. Both ion implantation and the first local oxidation appear necessary to create defects and both the thin nitride and annealing are required to prevent the defects.

EXAMPLE

The following outlines an exemplary process sequence:
1) Conventional local oxidation (field oxide, 700 nm)
2) Wet etch nitride
3) Wet etch pad oxide
4) Grow pad oxide (36 nm)
5) Deposit nitride (20 nm-70 nm)
6) Pattern nitride
7) Implant arsenic ($1 \times 10^{16}$ cm$^{-2}$, 100 keV)
8) Anneal #1 (500° C., 2 hr, nitrogen)
9) Anneal #2 (1000° C., Ar, 10 min-60 min)
10) Second local oxidation (900° C., steam, $\approx$300 nm).

Variations in the embodiment described will be apparent to and thought of by those skilled in the art. For example, the thin oxide may be removed when the first nitride layer is patterned.

We claim:

1. A method of fabricating a semiconductor integrated circuit comprising:
    oxidizing selected portions of a substrate to form first oxide regions;
    forming silicon nitride regions which cover a substantial portion of the first oxide regions and expose a substantial portion of said substrate, said substrate having an oxide surface, said silicon nitride regions having a thickness approximately equal to the thickness of said oxide surface;
    ion implanting into the substrate between said silicon nitride regions;
    annealing; and
    oxidizing said exposed substrate regions to form second oxide regions.

2. A method as recited in claim 1 in which said surface oxide and said nitride layer have a thickness less than 70 nm.

3. A method as recited in claim 2 in which said oxide and said nitride layers have a thickness between 30 nm and 40 nm.

4. A method as recited in claim 1 in which said annealing is at first and second temperatures, said second temperature being greater than said first temperature.

* * * * *